(12) United States Patent
Becker et al.

(10) Patent No.: US 10,910,082 B1
(45) Date of Patent: Feb. 2, 2021

(54) APPARATUS AND METHOD

(71) Applicant: Arm Limited, Cambridge (GB)

(72) Inventors: Alan Jeremy Becker, Bushey (GB);
Loïc Pierron, Cambridge (GB)

(73) Assignee: Arm Limited, Cambridge (GB)

( * ) Notice: Subject to any disclaimer, the term of this patent is extended or adjusted under 35 U.S.C. 154(b) by 0 days.

(21) Appl. No.: 16/527,228

(22) Filed: Jul. 31, 2019

(51) Int. Cl.
*G11C 29/38* (2006.01)
*G11C 29/18* (2006.01)
(Continued)

(52) U.S. Cl.
CPC ............ *G11C 29/38* (2013.01); *G11C 11/417* (2013.01); *G11C 11/418* (2013.01); *G11C 11/419* (2013.01); *G11C 29/18* (2013.01)

(58) Field of Classification Search
None
See application file for complete search history.

(56) References Cited

U.S. PATENT DOCUMENTS 9,432,298 B1 * 8/2016 Smith ................. H04L 49/9057
9,984,766 B1 * 5/2018 Becker .................... G11C 29/12
(Continued)

OTHER PUBLICATIONS

A. Becker, "SRAM and ECC Logic Testing Using On-line MBIST," IEEE International Workshop on Automotive Reliability and Test, Nov. 2018, Phoenix, Arizona, USA, 6 pages.*

*Primary Examiner* — Muna A Techane
(74) *Attorney, Agent, or Firm* — Nixon & Vanderhye P.C.

(57) ABSTRACT

Apparatus comprises memory circuitry having a plurality of addressable memory entries storing respective data items and associated error protection codes; memory error protection circuitry to generate the error protection code for a data item stored to the memory circuitry, the error protection code for a given data item stored to the memory circuitry depending upon at least the given data item and a memory address defining a memory entry to which the given data item is stored, and to perform a check operation to check for consistency between a retrieved data item, the memory address defining a memory entry from which the given data item is retrieved and the error protection code associated with the retrieved data item; memory built-in self-test circuitry to test the memory and memory error protection circuitry; and access circuitry to provide an indirect access path between the memory built-in self-test circuitry a memory which accesses the memory circuitry via the memory error protection circuitry and a direct access path between the memory built-in self-test circuitry and a memory entry which bypasses the memory error protection circuitry; the memory built-in self-test circuitry being configured to execute a test operation by writing a test value to a first memory entry of the memory circuitry having a first test memory address via the indirect access path; retrieving the test value and associated error protection code from the first memory entry by the direct access path; writing the retrieved test value and associated error protection code to a second memory entry having a second test memory address via the direct access path, there being a difference in at least one bit between the first test memory address and the second test memory address; and retrieving the test value and associated error protection code from the second memory entry via the indirect access path; the memory built-in self-test circuitry comprising fault detection circuitry configured to detect a fault condition when the result of the check operation performed by the memory error protection circuitry is inconsistent with the difference between the first test memory address and the second test memory address.

12 Claims, 5 Drawing Sheets

(51) Int. Cl.
*G11C 11/417* (2006.01)
*G11C 11/419* (2006.01)
*G11C 11/418* (2006.01)

(56) References Cited

U.S. PATENT DOCUMENTS

| | | | |
|---|---|---|---|
| 10,580,513 B2 * | 3/2020 | Maeda | G11C 29/38 |
| 2007/0226551 A1 * | 9/2007 | Janke | G06K 19/07372 |
| | | | 714/703 |
| 2008/0126893 A1 * | 5/2008 | Harrand | G11C 7/04 |
| | | | 714/719 |
| 2014/0040692 A1 * | 2/2014 | Shah | G11C 29/021 |
| | | | 714/736 |
| 2018/0232477 A1 * | 8/2018 | Mazzawi | G06F 30/33 |

* cited by examiner

APPARATUS AND METHOD

BACKGROUND

This disclosure relates to apparatus and methods.

Some circuitry testing techniques can operate in an "online" mode, which is to say that the testing is performed while the circuitry under test is in use.

In the case of, for example, the testing of memory circuitry, it can also be desirable to test the correct operation of memory error protection circuitry such as error correcting code (ECC) circuitry and/or parity checking circuitry.

SUMMARY

In an example arrangement there is provided apparatus comprising:

memory circuitry having a plurality of addressable memory entries storing respective data items and associated error protection codes;

memory error protection circuitry to generate the error protection code for a data item stored to the memory circuitry, the error protection code for a given data item stored to the memory circuitry depending upon at least the given data item and a memory address defining a memory entry to which the given data item is stored, and to perform a check operation to check for consistency between a retrieved data item, the memory address defining a memory entry from which the given data item is retrieved and the error protection code associated with the retrieved data item;

memory built-in self-test circuitry to test the memory and memory error protection circuitry; and access circuitry to provide an indirect access path between the memory built-in self-test circuitry a memory which accesses the memory circuitry via the memory error protection circuitry and a direct access path between the memory built-in self-test circuitry and a memory entry which bypasses the memory error protection circuitry;

the memory built-in self-test circuitry being configured to execute a test operation by writing a test value to a first memory entry of the memory circuitry having a first test memory address via the indirect access path; retrieving the test value and associated error protection code from the first memory entry by the direct access path; writing the retrieved test value and associated error protection code to a second memory entry having a second test memory address via the direct access path, there being a difference in at least one bit between the first test memory address and the second test memory address; and retrieving the test value and associated error protection code from the second memory entry via the indirect access path;

the memory built-in self-test circuitry comprising fault detection circuitry configured to detect a fault condition when the result of the check operation performed by the memory error protection circuitry is inconsistent with the difference between the first test memory address and the second test memory address.

In another example arrangement there is provided a method comprising:

storing respective data items and associated error protection codes using memory circuitry having a plurality of addressable memory entries;

generating, using memory error protection circuitry, the error protection code for a data item stored to the memory circuitry, the error protection code for a given data item stored to the memory circuitry depending upon at least the given data item and a memory address defining a memory entry to which the given data item is stored;

performing a check operation to check for consistency between a retrieved data item, the memory address defining a memory entry from which the given data item is retrieved and the error protection code associated with the retrieved data item;

providing, using access circuitry, an indirect access path between memory built-in self-test circuitry a memory which accesses the memory via the memory error protection circuitry and a direct access path between the memory built-in self-test circuitry and a memory entry which bypasses the memory error protection circuitry;

the memory built-in self-test circuitry executing a test operation by:

writing a test value to a first memory entry of the memory circuitry having a first test memory address via the indirect access path;

retrieving the test value and associated error protection code from the first memory entry by a direct access path which bypasses the error protection circuitry;

writing the retrieved test value and associated error protection code to a second memory entry having a second test memory address different to the first test memory address via the direct access path; and retrieving the test value and associated error protection code from the second memory entry via the indirect access path; and detecting a fault condition when the result of the check operation performed by the memory error protection circuitry is inconsistent with the difference between the first test memory address and the second test memory address.

Further respective aspects and features of the present technology are defined by the appended claims.

BRIEF DESCRIPTION OF THE DRAWINGS

The present technique will be described further, by way of example only, with reference to embodiments thereof as illustrated in the accompanying drawings, in which.

DESCRIPTION OF EMBODIMENTS

Figure 1:
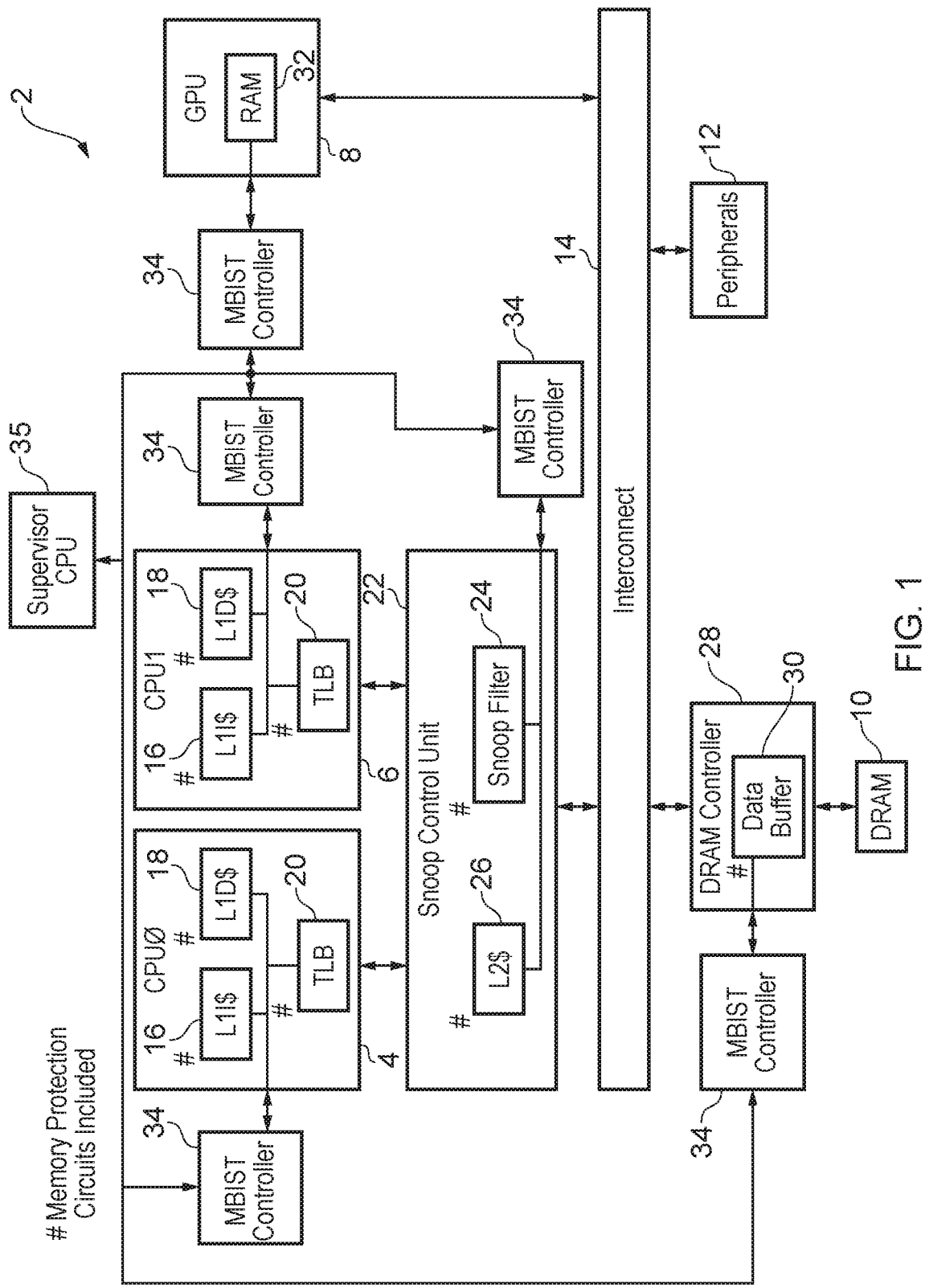
FIG. 1 schematically illustrates a data processing apparatus.

Turning now to the drawings, FIG. 1 schematically illustrates (by way of example) a data processing system 2, such as a system-on-chip integrated circuit, including a first processor core 4, a second processor core 6, a graphics processing unit 8, a main memory 10 and one or more peripherals 12 all connected via an interconnect 14. The first processor core 4 and the second processor core 6 each respectively contain a level one instruction cache 16, a level one data cache 18 and a translation lookaside buffer 20. In order to maintain coherency between the data cache within the first processor core 4 and the second processor core 6, a snoop control unit 22 serves to initiate snoop operations and coherency control utilizing, amongst other circuits, a snoop filter 24. The snoop control unit 22 also includes a level two cache 26 which is shared by the first processor core 4 and the second processor core 6. A DRAM controller 28 is disposed between the interconnect 14 and the main memory (DRAM) 10. The DRAM controller 28 includes a data buffer 30 for buffering data accessed within the main memory 10, such as providing buffer storage for multiple lines of data most recently accessed within the main memory 10. The graphics processing unit 8 includes a random access memory 32 used for graphics processing operations performed by the graphics processing unit 8.

As indicated by the "#" marker in FIG. 1, a variety of the different memories 16, 18, 20, 24, 26, 30 within the data processing system 2 of FIG. 1 are provided with memory error protection circuitry. The graphics processing unit 8 memory 32 in the example system as drawn does not have memory error protection circuitry, but it may be present in this or other graphics processor units. This memory error protection circuitry may take a variety of different forms, such as circuitry to generate an error protection code depending upon at least a memory address defining a memory entry to which a given data item is stored and the data item or data value itself (which includes both data values to be manipulated and instructions) as stored.

The error correction code value may be generated by the memory error protection circuitry as the data value is written into the memory and then read and checked by the memory error protection circuitry as the data value is read from the memory. In this way, data handling and/or address handling errors within the operation of the memory may be detected and potentially corrected (if not too severe).

It will be appreciated that there are many different ways in which the memory error protection circuitry may operate and there is generally a trade-off between the overhead associated with the processing and storage of parity and/or error correction codes weighed against the degree of error protection and error correction ability which they provide. It is also possible that data may be accessed within a given memory in a form in which the bit values accessed represent multiple data values each having separate associated parity and/or error correction codes, e.g. 128 bits of data may be accessed together and represent two 64-bit data words each with separate parity and/or error correction codes. It will also be appreciated that the way in which the memory error protection circuitry operates can differ, as between the occurrence of errors in the address and in the data value. It can be useful to provide error correction of errors in a data value. However, if an error is detected in a memory address, a useful outcome can simply be to flag this as an error condition rather than attempting to correct it.

The memories 16, 18, 20, 24, 26, 30, 32 within FIG. 1 each have an associated memory built-in self-test controller 34 (as an example of at least part of a memory built-in test circuitry) which serves to perform memory built-in self-test operations upon their respective memories under control of a supervisor processor 35. Note that it is not necessary to use a separate supervisor processor; the role and functionality of a supervisor processor could be provided by another (or more than one other) processor in the apparatus, alongside the other role(s) and functionality of the one or more other processors.

An individual memory built-in self-test controller 34 may be dedicated to performing built-in self-test operations upon an individual memory (e.g. in the case of the RAM memory 32 within the graphics processing unit 8) or may be shared between multiple memories (e.g. in the case of the level one instruction cache 16, the level one data cache 18 and the translation lookaside buffer 20 within the first processor 4).

Each memory may consist of multiple sub-memories (e.g. a cache may contain a tag RAM and a data RAM and each of these RAMs may be sub-divided into multiple ways or banks). Each sub-memory may have its own memory protection logic. Multiple MBIST controllers, 34, may be performing tests at the same time and so memories in different IP cores 4, 6, 8, 22, 28 may be tested in parallel.

When the supervisor processor 35 instructs one of the instances of the memory built-in self-test controller 34 to perform a built-in self-test operation upon one of its respective associated memories, the memory built-in self-test controller 34 acts to reserve one or more entries (represented by memory addresses) within the memory to be tested. If the associated processing circuitry 4, 6, 8, 22, 28 wishes to make use of those memory locations whilst they are reserved, then the processing circuitry is stalled until the built-in self-test operations have completed and the memory locations are released. This describes an on-line testing use model, in contrast to a production testing use model (in which an entire device's operation is unavailable for the duration of the test) or an off-line testing use model (in which a particular memory is made unavailable for the duration of the test, with operations otherwise continuing without the use of that disabled memory).

The testing can be arranged so as to have little effect on the operations of the processor, as discussed above. Over an extended period of time, the supervisor processor 35 instructs built-in self-test operations to be performed which (at least for SRAM testing) eventually cover all of the storage locations within a given memory so as to check the correct operation of the full memory. This mode of testing permits ongoing built-in self-test operations to be performed while the data processing system 2 is in field use and performing its functional processing operations.

Note that for memory protection logic testing it is not necessary to test all memory entries. However, it is appropriate to test all address bits, which can be achieved by testing a subset of memory entries. Also, all data bits including code fields can be tested, in which case this can be achieved by testing a minimum of one SRMA entry.

Figure 2:
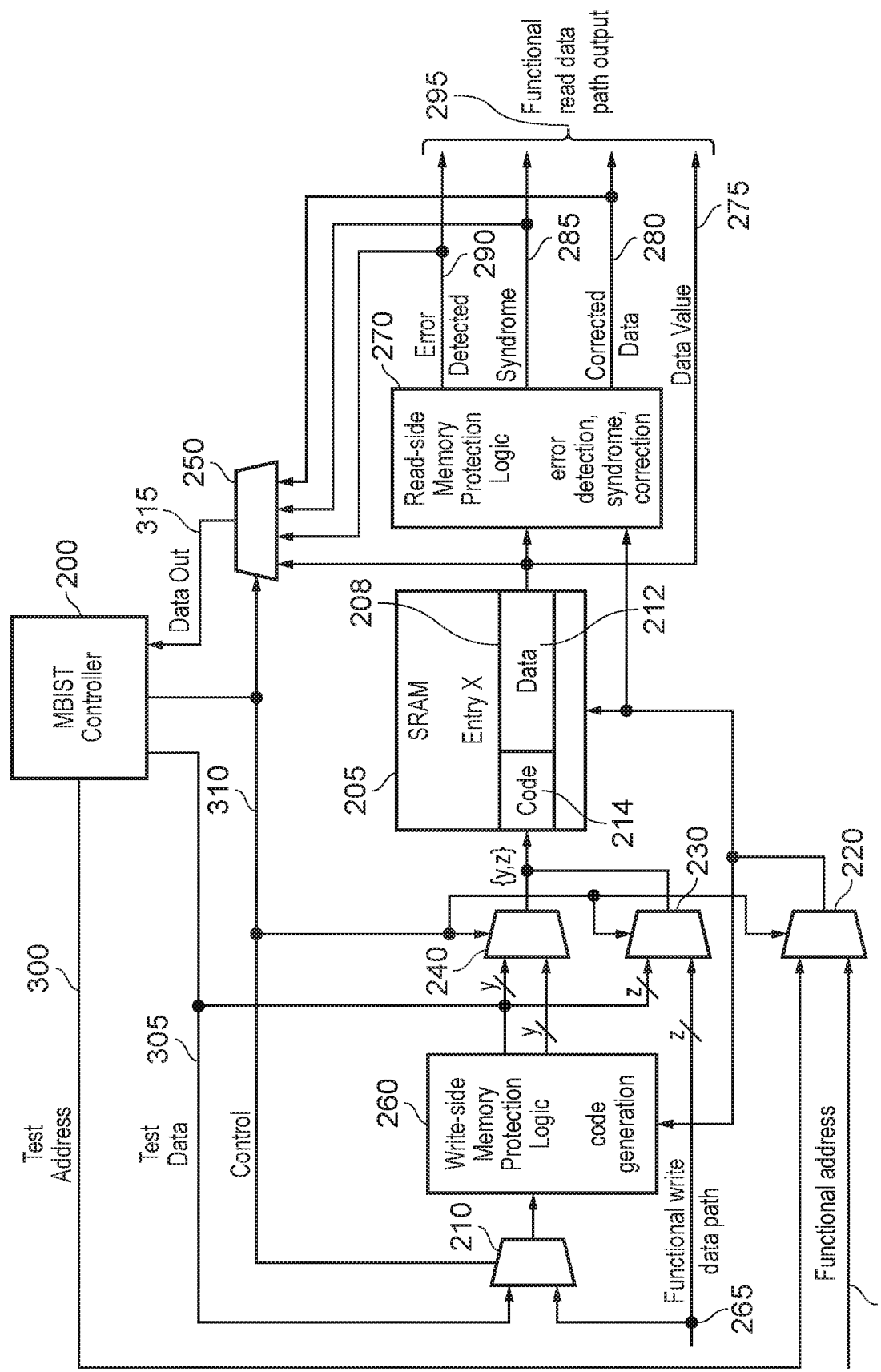
FIG. 2 schematically illustrates memory circuitry and associated memory error protection circuitry and memory built-in self-testing circuitry.

FIG. 2 schematically illustrates operations of a memory built-in self-test (MBIST) controller 200 in connection with the testing of memory circuitry 205, which is illustrated as an SRAM but may be a DRAM or other type of memory. Similarly, FIG. 2 represents a single instance of an MBIST controller 200 and a single instance of memory circuitry 205, but as discussed above in other examples there may be other than a one to one relationship between MBIST controllers and memories to be tested by those MBIST controllers.

The memory circuitry 205 provides a plurality of addressable memory entries (such as a memory entry 208) having fields storing a respective data item 212 and an associated error protection code 214. Note that the error protection codes 214 for a particular memory entry does not have to be concatenated with or stored in a location logically, physically or electrically adjacent to the corresponding memory entry; the representation in FIG. 2 is simply for clarity of the explanation.

The MBIST controller 200, for example a so-called PMC-100 MBIST controller provided by Arm Limited, can be for example a programmable MBIST Controller (PMC)

to support testing of RAM and memory protection logic using on-line MBIST. The MBIST controller 200 may be used by core specific software test library (STL) products to test memory protection logic, memory controller logic and the MBIST data path. In some examples the MBIST controller 200 may have a microcode engine (for example, embodied in or by a control processor 500 described below) that executes the test algorithms and an APB (Advanced Peripheral Bus) interface for programming. It can be programmed either by software running on the one or more CPUs 4, 6 (in a self-test mode) or by an external processor such as the supervisor processor 35 which can function, for example, as a safety agent within an SoC (System on Chip). In the present examples, the MBIST controller 200 is arranged to control operations of a number of multiplexers 210, 220, 230, 240, 250 in a manner to be described below.

Online MBIST

On-line MBIST is used by applications requiring functional safety and/or high reliability, to test for faults in memory circuitry and memory protection logic (for example, ECC and/or parity circuitry) in-field, during functional operation. The example algorithms to be discussed below can break or partition the testing into a series of short bursts or test cycles, for example each requiring fewer than 20 clock cycles and separated by intervals longer than the length of a burst (for example, intervals of more than 10000 cycles). In a burst or test cycle, the MBIST controller requests access to a target memory or associated memory protection logic, which locks this memory during a test burst. So it is not possible for functional software to access the target memory during the short burst test sequence. The relevant CPU can still execute normally during the testing but if it accesses the locked memory then the pipeline will stall until the lock is removed. When a burst is completed, the MBIST controller de-asserts the request which removes the lock on the memory.

In example arrangements the memory contents modified by the testing are saved and restored by the MBIST controller 200 during each burst as part of a test algorithm.

Functional Read/Write Operations

Referring to FIG. 2, turning first to a so-called functional operation of the memory circuitry 205, which is to say a "normal" operation in which operational or computational data relating from the functional operation is illustrated in FIG. 1 is to be stored to or retrieved from the memory circuitry 205, a functional memory address 255 is routed via the multiplexer 220 to the memory circuitry 205 (at which it identifies one of the addressable memory entries) and to write-side memory protection logic 260 which forms part of memory error protection circuitry as discussed above. Functional data 265 to be written to the addressed memory entry is similarly provided via the multiplexer 210 to the write-side memory protection logic 260 and, via the multiplexer 230, to the memory circuitry 205 to be written to the addressed memory entry.

For a functional data write operation, the write-side memory protection logic 260 generates an error protection code of y bits in dependence upon the functional write data 265 of z bits and the functional address 255. The error protection code and the functional write data are routed via the multiplexers 230, 240 to the memory circuitry 205 for writing to the code field 214 and the data item field 212 respectively of the currently addressed memory entry.

In terms of a functional read operation, the functional address 255 is provided via the multiplexer 220 to the memory circuitry 205 to address the required memory entry and to read-side memory protection logic 270, again form-ing part of the memory error protection circuitry. The data item field 212 and the code field 214 of the addressed entry 208 are also provided to the read-side memory protection logic 270. The data item field 212 (as read) is also provided as an output data value 275. The read-side memory protection logic 270 logic may provide functions such as error detection, syndrome generation and error correction so as to generate various other output signals including one or more of: corrected data 280, a syndrome value 285 and an error detected flag 290. Collectively, these three outputs along with the data value 275 provide a functional read data path output 295.

Operation of the multiplexers 210 . . . 250 in the case of functional access is summarised below:

| Multiplexer | Signal routing in functional read/write operation |
| --- | --- |
| 210 | Functional write data 265 to write-side memory protection logic 260 |
| 220 | Functional address 255 to write-side memory protection logic 260, memory circuitry 205 and read-side memory protection logic 270 |
| 230 | Functional write data to memory circuitry 205 |
| 240 | Code generated by write-side memory protection logic 260 to memory circuitry 205 |
| 250 | No output |

MBIST Testing Operation, Direct and Indirect Access Paths

In the testing operations to be described below, two types of access paths between the MBIST controller 200 and the memory circuitry 205 will be referred to as a so-called "direct" access path and a so-called "indirect" access path. The direct access path between the MBIST circuitry 200 and the memory circuitry 205 bypasses the memory error protection circuitry 260, 270. The indirect access path between the MBIST circuitry 200 and the memory circuitry 205 is via the memory error protection circuitry 260, 270. The multiplexers 210 . . . 250 represent an example of access circuitry to provide each of these paths.

Therefore, in example arrangements the MBIST controller can do one or more of:

Read and write to/from the memory by the direct access path, bypassing the memory protection logic. Hence, it can access the data and ECC/parity code fields already stored in memory.

Write to a memory via the ECC/parity generation logic (the indirect access path). Hence, the ECC/parity and data fields stored in memory originate with the memory error protection circuitry and the MBIST controller respectively. The ECC/parity generation logic input is the data field value from the MBIST controller.

Read the memory via the ECC/parity checking logic (the indirect access path). This allows the MBIST controller to read the protection logic check result which indicates either if no error, a correctable error or an un-correctable error is detected.

Read the memory via the syndrome logic (the indirect access path). This indicates which bit contains an error when a correctable error is detected.

Read the memory via the data correction logic (the indirect access path). This allows the corrected data value to be read.

Indirect Access Path

On the write side, the MBIST controller 200 can generate a test address 300 to address an entry in the memory circuitry 205 to be subject to testing, and can generate test write data 305 to be written to the entry in the memory circuitry 205 addressed by the test address 300 using the indirect access path.

According to the indirect access path, the test address 300 is provided to the multiplexer 220 which (like all of the multiplexers 210 . . . 250) operates under the control of a control signal or signals 310 provided by the MBIST controller 200. The multiplexer 220 routes the test address 300 in place of the functional address 255 to the write-side memory protection logic 260 and to the memory circuitry 205. The game, in the indirect access path, the test data 305 is routed by the multiplexer 210 in place of the functional dated hundred and 65 to the write-side memory protection logic and is also routed via the multiplexer 230 in place of the functional write data to the memory circuitry 205.

So, using the access circuitry in this manner, the indirect access path for data write operations are overseen by the MBIST controller 200 is very similar to the functional write data path, in that the test data and test address take the place of the functional data and functional address and/or processed in an equivalent way by the write-side memory protection logic to generate values for writing to the currently addressed entry in the memory circuitry 205.

On the read side, the data value read from the currently addressed entry is provided, along with other components of the outputs of the read-side memory protection logic 270 to the multiplexer 250 and from there to the MBIST controller 200 as test output data 315. So, again using the indirect access path, the test data read operation from the memory circuitry 205 is almost exactly equivalent to the functional reads data operation described above.

The routing operation of the multiplexers 210 . . . 250 in the indirect access path between the MBIST controller 200 and the memory circuitry 205 is summarised below:

| Multiplexer | Signal routing in indirect access path operation |
|---|---|
| 210 | Test data 305 to write-side memory protection logic 260 |
| 220 | Test address 300 to write-side memory protection logic 260, memory circuitry 205 and read-side memory protection logic 270 |
| 230 | Test data 305 to memory circuitry 205 |
| 240 | Code generated by write-side memory protection logic 260 to memory circuitry 205 |
| 250 | Data value 275 and outputs 280, 285, 290 of read-side memory protection logic 270 to MBIST controller 200 |

Direct Access Path

For use in part of the testing process to be described below, the access circuitry comprising the multiplexers 210 . . . 250 can be configured under control of the control signal(s) 310 to provide a direct access path between the MBIST controller 200 and the memory circuitry 205. The direct access path bypasses the memory error protection circuitry comprising the write-side memory protection logic 260 and the read-side memory protection logic and allows test write or read operations to be performed directly to and from memory entries in the memory circuitry 205. To achieve this, the multiplexer 240 can route a portion of the test data 305 to the memory circuitry 205 in place of a code generated by the write-side memory protection logic 260, and the multiplexer 250 can route the code and data item read from the currently addressed memory entry 208 directly to the MBIST controller 200 rather than necessarily being processed by the read-side memory protection logic.

Therefore, in the direct access path, the operation of the multiplexers 210 . . . 250 is as follows:

| Multiplexer | Signal routing in direct access path operation |
|---|---|
| 210 | No output (or can pass test data 305 to write-side memory protection logic 260, but the output of the write-side memory protection logic 260 is not itself used) |
| 220 | Test address 300 to write-side memory protection logic 260, memory circuitry 205 and read-side memory protection logic 270 |
| 230 | Test data 305 to memory circuitry 205 |
| 240 | Part of test data 305 to memory circuitry 205 in place of code generated by write-side memory protection logic 260 |
| 250 | Data value 275 and code read from memory circuitry 205 to MBIST controller 200 |

Memory Error Protection Circuitry

Memory error protection circuitry, for example ECC (error correcting code) or parity circuitry, can be used to protect memory data and address logic. This protection technique can protect against faults in memory circuits that are categorised as being either transient or permanent faults. Transient faults are typically caused by single event upsets that flip individual bits in the memory. Single bit flips in memory bit cells can be corrected using SECDED (single error correct, double error detect) ECC techniques. Permanent faults can be caused by transistor or metal failures that result in a signal being stuck at 1 or 0. This can cause individual bits in memory to be stuck at 1 or 0 and other memory circuits such as address decoders to have a signal that is stuck at 1 or 0.

The data and address are protected using a code that is stored in association with the data in memory. Memory protection logic consists of three parts, protection code generation (used during memory writes), error detection (used during reads) and error correction (used during reads). Faults in the memory that stores the ECC/parity code field are also protected by the memory protection logic.

Address protection protects against faults in the address path (including any pipeline registers or address decoding logic) from the core to the memory and the address decoding logic within memory circuitry.

FIG. 2 therefore provides an example of apparatus comprising:
  memory circuitry 205 having a plurality of addressable memory entries 208 storing respective data items and associated error protection codes (in fields 212, 214 respectively);
  memory error protection circuitry 260, 270 to generate the error protection code for a data item stored to the memory circuitry, the error protection code for a given data item stored to the memory circuitry depending upon at least the given data item and a memory address defining a memory entry to which the given data item is stored, and to perform a check operation to check for consistency between a retrieved data item, the memory address defining a memory entry from which the given data item is retrieved and the error protection code associated with the retrieved data item;
  memory built-in self-test circuitry 200 to test the memory and memory error protection circuitry; and
  access circuitry 210, 220, 230, 240, 250 to provide an indirect access path between the memory built-in self-test circuitry a memory which accesses the memory circuitry via the memory error protection circuitry and a direct access path between the memory built-in self-test circuitry and a memory entry which bypasses the memory error protection circuitry;

the memory built-in self-test circuitry being configured to execute a test operation by writing a test value to a first memory entry of the memory circuitry having a first test memory address via the indirect access path; retrieving the test value and associated error protection code from the first memory entry by the direct access path; writing the retrieved test value and associated error protection code to a second memory entry having a second test memory address via the direct access path, there being a difference in at least one bit between the first test memory address and the second test memory address; and retrieving the test value and associated error protection code from the second memory entry via the indirect access path;

the memory built-in self-test circuitry comprising fault detection circuitry (500, see below) configured to detect a fault condition when the result of the check operation performed by the memory error protection circuitry is inconsistent with the difference between the first test memory address and the second test memory address.

Example operations of the memory error protection circuitry 260, 270 will now be described with reference to FIG. 3. An example of memory error protection circuitry is so-called ECC (error correction code) circuitry, and such an example will be discussed in more detail in the following paragraphs. However, significantly, the present techniques relating to memory testing apparatus and methods are not limited to any individual type of memory error protection circuitry and indeed a technical advantage of the present disclosure is that the techniques are in fact independent of the particular type of circuitry or protection methodology used by the memory error protection circuitry. So, the discussion of FIG. 3 should be considered merely as an example of one type of memory error protection circuitry to which the present disclosure is applicable.

ECC circuitry can be used to protect data stored in memory using additional redundant bits in each memory entry to store the ECC code for the memory entry. Hence, each memory entry can contain two fields, one for the ECC code (an example being the field 214 discussed above) and one for the data item (an example being the field 212 discussed above). Typically, single error correct double error detect (SECDED) ECC schemes are used in respect of the data item. These allow double bit errors in an entry to be detected and single bit errors to be corrected. However, it will be appreciated that other schemes allowing potentially different respective numbers of error bits to be detected and/or corrected may be used.

In the present examples, such a protection scheme is extended or also used to provide at least a degree of protection to the address of the memory entry.

In such a case the ECC code protects both the data item and the address field. Address protection protects against faults in the address path (including for example any pipeline registers or address decoding logic) from the core to the memory circuitry (for example SRAM) and the address decoding logic within an SRAM.

The address protection provided by the memory error protection circuitry may not in some example embodiments be wide enough not cover all address bits for the associated memory; in such a case only the lower address bits would normally be covered.

ECC Write-Side Operations

Figure 3:
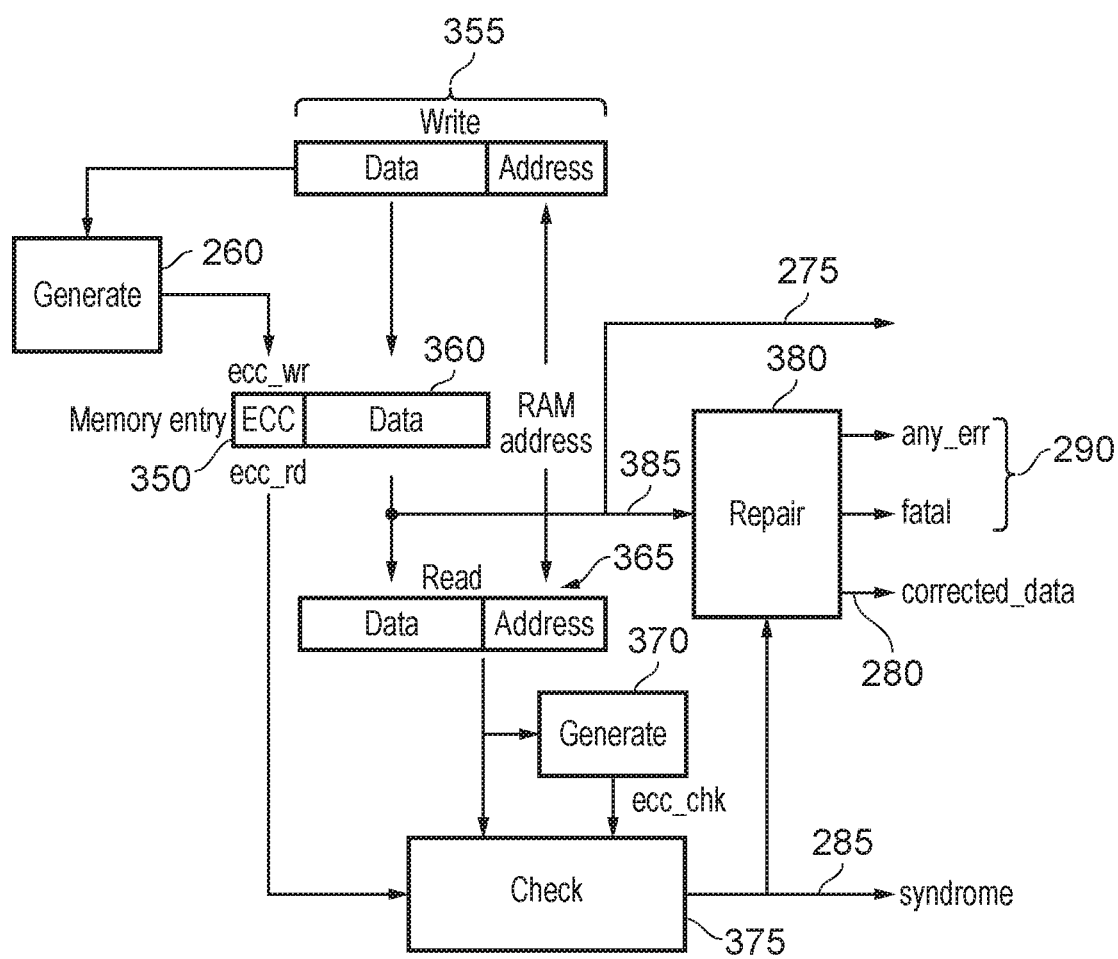
FIG. 3 schematically illustrates the operation of memory error protection circuitry.

Comparing FIG. 3 with FIG. 2, in a write operation, the write-side memory protection logic 260 can be arranged to generate or calculate an ECC code (ecc_wr) 350 from a concatenation or other combination 355 of the data and address value.

The ECC code ecc_wr is stored by the memory circuitry. This can be using some otherwise redundant bits of the relevant memory entry or the storage could in principle be provided elsewhere within the memory circuitry. In other words, there is no technical requirement for the ECC code to be stored logically, electrically or physically adjacent to the respective data item 360, but in many practical instances this would in fact be the expected arrangement.

ECC Read-Side Operations

At the read-side, the data item 360 and the associated ECC code (referred to in the read-side processing as ecc_rd in FIG. 3) are retrieved from the memory entry associated with a memory address. A concatenation 365 of the retrieved data item 360 and the memory address is formed and an ECC code ecc_chk is generated by check code generation circuitry 370 based on the concatenation 365 of the retrieved data item and the address field.

The check code generation circuitry 370 uses the same technique or algorithm as the write-side circuitry 260 to generate its respective ECC code. So, in the example arrangement shown in FIG. 3, assuming that the stored data 360 was not corrupted and there was no fault in the handling of the memory address, the ECC code ecc_chk should be identical to the retrieved ECC code ecc_rd.

Check circuitry 375 is responsive to the newly generated ECC code ecc_chk and to the retrieved ECC code ecc_rd to generate a so-called syndrome value or vector 285. In at least some examples, the syndrome 380 can indicate bit positions within the concatenation 365 of the data item and address for which a bit error is detected. In some examples, a syndrome of all zeros indicates a successful checking operation or in other words that no errors are detected. The syndrome 285 is provided as an output of the read-side memory protection logic 270 of FIG. 2.

Repair circuitry 380 is provided to correct any detected bit errors to the extent that such correction is possible under the ECC scheme in use. The repair circuitry 380 uses known error correction techniques to perform such a correction or repair to the retrieved data item 385 on the basis of the syndrome 285 and can provide as outputs the corrected data 280 (if a correction is indeed possible- and error of too many bits may be impossible to correct in at least some example arrangements) along with flags 290 indicating one or both of "an error has occurred" and "it has been impossible to correct a detected error, or in other words the error is fatal".

Hence, using these arrangements, an ECC error can be detected if a fault occurs in the address logic during functional operation which causes, for example, the wrong memory entry to be read, because in such a situation the retrieved ECC code ecc_rd would not be consistent with the ECC code ecc_chk generated by the. check code generation circuitry 370. Note that by basing the error protection code on the address as well as the data, the error protection ECC code is different for each memory entry even if they contain the same data value.

As discussed above, the ECC code is calculated for the concatenation of the data and address value. Hence, an ECC error will be detected if a fault occurs in the address logic during functional operation, which causes the wrong RAM entry to be read. In examples, an SECDED ECC schemes is used which provide detection of one and two bit errors and these errors can be detected anywhere within the three fields. Hence, it is possible for this scheme to detect up to two incorrect address bits. However, faults in the address field are indicated as un-correctable (fatal) errors. For example, an un-correctable ECC error will be indicated if address bit [2] is stuck at 1, causing a read of address 0 to return the memory entry value from address 4.

Comparing FIG. 3 with FIG. 2 once again, the read-side memory protection logic 270 of FIG. 2 is represented by the check code generation circuitry 370, the check circuitry 375 and the repair circuitry 380.

Example MBIST Operations

The MBIST techniques described here address the issue of testing memory performance, for example including memory error protection circuitry (such as ECC/parity circuitry) in the field. Operations are performed by the MBIST controller 200 under hardware or software control.

The test methods are universal, meaning that they support any circuitry having memory circuitry with memory error protection circuitry using any memory protection scheme within or equivalent to the claimed definition such as an ECC/parity scheme.

In example embodiments the testing techniques can be software transparent, preserve memory coherency, preserve memory contents, access all embedded memories, access memories directly (bypassing protection logic), access memories via protection logic, not affect security, be run with interrupts enabled, and/or have little impact on interrupt latency.

The methods described in the present disclosure can test all parts of memory protection logic, including the address protection logic. As mentioned above, the methods are agnostic to the memory error protection scheme (for example, ECC/party scheme) used and the MBIST controller does not need to know how a scheme is implemented for the memory circuitry under test.

The methods can test for stuck-at 1 and stuck-at 0 faults in each address or data bit within the memory protection logic and use the same basic principal, allowing common MBIST controller hardware to be used to implement all four algorithms. They generate test patterns, which drive the address signals and can in some examples use a fixed base pattern, BP, its inverse, ~BP (where the symbol ~represents a bitwise inversion), a mask value XM and an XOR function. Each algorithm is potentially carried out twice, once using BP and once using ~BP, the order not being important.

BP may have any value and the algorithms may be run multiple times with different BP values to increase fault coverage. The algorithms are normally carried out with one XM bit set to 1 and the others set to 0 but they may also be carried out with multiple bits set to 1 to test ECC schemes that can detect two or more faults, or when an MBIST controller accesses data containing multiple protection code fields.

The algorithms contain a loop that can test each address bit in turn by using a different XM value for each loop iteration. The order that the address or data bits are tested in is not important and nor is it important how XM is generated during each iteration of the loop. XM generation methods may include for example, shift registers, counters, LFSRs, etc. The example algorithms below may for example use a shift register by which XM is shifted by one position left in each loop iteration.

The methods generate test patterns that guarantee that each TP bit is tested with 0 and 1 by inverting the base pattern one bit at a time. Hence, the value of at least two bits changes between each loop iteration.

The test method discussed below has the following features:

Saving and restoring the memory data modified during testing. This ensures that memory contents are preserved, including any errors present in the entries. Hence, memory is not corrupted by generating valid protection codes for faulty data. If an error is present in the data it will be dealt with in the normal way during functional reads.

Initializing the ECC/parity code field in memory entries before they are used. Hence, no assumption is made that the protection code field is valid. Cache tag RAMs are normally initialized but cache data RAMs are not. Hence, data RAMs may contain a mixture of initialized and uninitialized entries and the algorithms automatically handle both cases. This also ensures that any soft errors in the data do not affect the testing.

Capability of being suspended after each loop iteration to minimise the time that a memory is locked, reducing interrupt latency.

Using the error detection and correction logic to check for faults in the protection code generation logic and vice versa.

The MBIST controller 200 can make use of the following hardware to implement the example algorithms:

A mask register.

Three data registers.

A base pattern value, this may be fixed or allow different values to be used.

A shift function to shift the mask register left one position.

An XOR function that is used to invert bits in the address or data that are indicated by the mask register. This allows different address and data patterns to be generated and errors to be injected in the address or data.

The ability to control the memory protection logic and direct memory MBIST access multiplexers within an IP core on a transaction basis.

An example MBIST controller will be described below with reference to FIG. 5.

The example algorithms refer to the following variables:

Three data variables X, Y and Z stored in the respective data registers. These can contain the data and code fields when direct memory reads and writes are performed An address variable A.

A mask variable XM.

A fixed data pattern BP. This may be any value, and as discussed above, test may be repeated with different respective values BP Testing assumes the memory circuitry itself to be fault free. Hence, a single event upset that occurs during testing may cause a test to fail. Thus, if a test fails it should be run again to ensure that a single event upset did not cause the failure.

The following loop may be repeated for all protected memory address bits. The algorithm detects faults in the code generation and address error detection logic that prevent it from detecting faults in memory address decoder circuits. It generates addresses that are based on BP and injects one or more errors into each address bit by inverting them in turn and by copying one entry to another. Hence, it uses two memory entries, A XOR XM and A, which are the source and destination addresses of the copy operation respectively. The data field value is not important and in this case a fixed value, FP may be used, for example a repeating b01010101 value. The XM variable is initialized to 1 for single address bit error injection.

Basic Loop of Testing Algorithm

The memory under test is locked by the MBIST controller 200 for the duration of a test burst, so that the functional logic prevents access by other data processing circuitry to at least the memory entries defined by a first test memory address and a second test memory address. Pseudo code for the address protection logic test algorithm is as follows:

for each A (BP, ~BP) {
    for (i=0; i<protected address width; i++) {
        1. Read RAM entry (A XOR XM) and store in X (save entry)
        2. Write FP to RAM entry (A XOR XM) via ECC generation logic (the indirect access path) (initialize entry)
        3. Read RAM entry A by the direct access path and store in Y (save entry)
        4. Read RAM entry (A XOR XM) by the direct access path and store in Z
        5. Write Z to RAM entry A by the direct access path (injects address error)
        6. Read RAM entry A via ECC checking logic (the indirect access path) and check that a non-correctable ECC error is reported
        7. Write X to RAM entry (A XOR XM) by the direct access path (restore entry)
        8. Write Y to RAM entry A by the direct access path (restore entry)
        9. Read RAM entry (A XOR XM) by the direct access path and check that it is equal to X
        10. Read RAM entry A by the direct access path and check that it is equal to Y
        11. XM<<1 (generate next XM value)
    }
}

The test may also be executed to check that two faults can be detected by setting two bits in the XM variable to 1.

Notes on the Technique (a) Steps 1, 3, 7 and 8 allow the testing to be transparent to normal operation of the memory, which can be resumed after execution of each iteration of the inner loop, by saving the current contents of the memory entries under test and restoring them at the end of the inner loop. Steps 9 and 10 affirm that the restoration has been correctly performed. Note that in some examples steps 1, 3, 7, 8, 9 and 10 may be omitted if the contents of entries A and (A XOR XM) do not need to be preserved. In this case only one data variable is required to implement the test method.

(b) in some examples, even if steps 1, 3, 7 and 8 are used, steps 9 and 10 are not essential to the test method and may be omitted.

(c) In some examples, a single iteration of steps 1-10 can be performed as a test cycle, with a next test cycle (being implemented by applying a next XM value at step 11) being performed after an interval of normal operation. The interval may be of the order of tens of thousands of clock cycles, compared with the length (of the order of tens of clock cycles) of the test cycle, so that the effect of the testing process on normal operation of the memory is relatively small. In this way, the memory built-in self-test circuitry is configured to execute groups of one or more test operations interspersed by intervals during which access to the memory circuitry by other data processing circuitry is allowed, in which the each interval is longer than the length of a group of one or more test operations.

(d) In some examples steps 3, 8 and 10 may be placed outside the inner loop if testing is not suspended after a loop iteration. In other words, if a series of multiple test cycles (each referring to a respective XM value) are performed without an intervening interval of normal operation, the step 3 can be performed before the series of test cycles is started, and the steps 8 and 10 can be performed at the end of the series of test cycles, because the address A does not vary from test cycle to test cycle within the series. the steps 1, 7 and 9 are still required for each test cycle because the address A XOR XM does vary from test cycle to test cycle.

Generation and Progression of XM

The XOR operation implies that any bit of the mask value XM which is set to a 1 causes an inversion of a corresponding bit of A.

The mask XM can be initialised in dependence upon how many bit errors are being tested for. In some examples, where, for example, two bit errors can be detected, it may be useful to set the number of 1s in the initial XM to be no more than that same number (two). In some examples, only one bit of the initial XM is set to 1.

At the step 11, the value of XM is changed. An example of such a change is a bit shift or bit rotation operation, for example a shift left by one bit. If, for example, the bit shift is a left shift, then it can be useful to set the initial one or more 1s as the one or more least significant bits (LSBs) of the initial value of XM, so that the progression of XM over the course of a set of test cycles (for a potentially simplified eight bit example) is as follows:

| | |
|---|---|
| initial value used in test cycle 1 | 00000001 |
| test cycle 2 | 00000010 |
| test cycle 3 | 00000100 |
| test cycle 4 | 00001000 |
| test cycle 5 | 00010000 |
| test cycle 6 | 00100000 |
| test cycle 7 | 01000000 |
| test cycle 8 | 10000000 |

If two bits are set to 1 (so as to invert two address bits at each test cycle) or if a bit other than the LSB is initially set to 1, then a rotation rather than a simple bit shift can be used at the step 11.

In other examples, the step 11 can involve selecting the next in a series of different XM values, for example by moving to the next in a pseudorandom series of it sequences. It is not necessarily a problem if the same pattern is used more than once, but for efficient and thorough testing, examples arrangements use different patterns at each test cycle.

By the progression of XM in this way, the memory built-in self-test circuitry is configured to execute a succession of test operations, each for a different respective pair of a first test memory address and a second test memory address. By carrying out a series of test cycles with a common value A, the succession of test operations are configured to use a common memory address as one of the first test memory address and the second test memory address but for each test operation of the succession of test operations, different respective sets of bits are inverted to generate the other of the first test memory address and the second test memory address.

Therefore, in the example of FIG. 3, the memory error protection circuitry comprises: write-side memory error protection circuitry 260 to generate the error protection code for a data item stored to the memory circuitry; and read-side memory error protection circuitry 270 to perform a check operation to check for consistency between a retrieved data item, the memory address defining a memory entry from which the given data item is retrieved and the error protection code associated with the retrieved data item. In examples, the read-side memory error protection circuitry is configured to generate (by circuitry 370) a check error protection code ecc_chk from a read memory address and a data item retrieved from the read memory address, and to compare (by circuitry 375) the check error protection code with the error protection code ecc_rd retrieved from the read memory address. In examples, the read-side memory error protection circuitry comprises error correction circuitry 380 to correct errors of up to p bits in a retrieved data item.

Summary of Testing Method

A testing method or technique will now be summarised, involving storing respective data items and associated error protection codes using memory circuitry having a plurality of addressable memory entries; generating, using memory error protection circuitry, the error protection code for a data item stored to the memory circuitry, the error protection code for a given data item stored to the memory circuitry depending upon at least the given data item and a memory address defining a memory entry to which the given data item is stored; performing a check operation to check for consistency between a retrieved data item, the memory address defining a memory entry from which the given data item is retrieved and the error protection code associated with the retrieved data item; and providing, using access circuitry, an indirect access path between memory built-in self-test circuitry a memory which accesses the memory via the memory error protection circuitry and a direct access path between the memory built-in self-test circuitry and a memory entry which bypasses the memory error protection circuitry.

The method therefore has relevance to an apparatus as described above, which (in the example discussed above) comprises:

memory circuitry 205 having a plurality of addressable memory entries 208 storing respective data items (in respective fields 212) and associated error protection codes (in respective fields 214);

memory error protection circuitry 260, 270 to generate (260) the error protection code for a data item stored to the memory circuitry, the error protection code for a given data item stored to the memory circuitry depending upon at least the given data item and a memory address defining a memory entry to which the given data item is stored, and to perform (270) a check operation to check for consistency between a retrieved data item, the memory address defining a memory entry from which the given data item is retrieved and the error protection code associated with the retrieved data item;

memory built-in self-test circuitry 200 to test the memory and memory error protection circuitry; and access circuitry 210, 220, 230, 240, 250 to provide an indirect access path (as discussed above, using the multiplexers 210 . . . 250 in the example) between the memory built-in self-test circuitry a memory which accesses the memory circuitry via the memory error protection circuitry and a direct access path (again, as discussed above, using the multiplexers 210 . . . 250 in the example) between the memory built-in self-test circuitry and a memory entry which bypasses the memory error protection circuitry.

Figure 4:
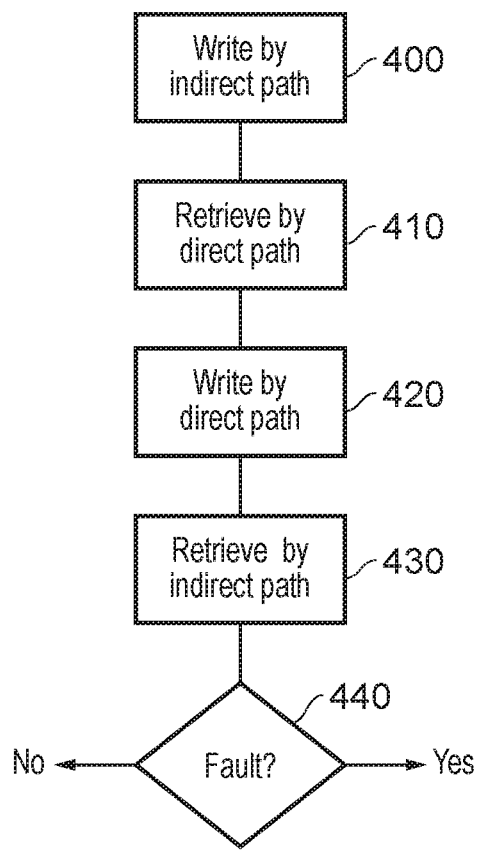
FIG. 4 is a schematic flowchart illustrating a method.

Referring to FIG. 4, the example method comprises the memory built-in self-test circuitry:

writing (at a step 400, corresponding to the step 2 in the algorithm above) a test value to a first memory entry (A XOR XM) of the memory circuitry having a first test memory address via the indirect access path;

retrieving (at a step 410, corresponding to the step 4 in the algorithm above) the test value and associated error protection code from the first memory entry by the direct access path;

writing (at a step 420, corresponding to the step 5 in the algorithm above) the retrieved test value and associated error protection code to a second memory entry (A) having a second test memory address different to the first test memory address;

retrieving (at a step 430, corresponding to the reading operation of step 6 in the algorithm above) the test value and associated error protection code from the second memory entry via the indirect access path; and detecting (at a step 440, corresponding to the checking operation of step 6 in the algorithm above) a fault condition when the result of the check operation performed by the memory error protection circuitry is inconsistent with the difference between the first test memory address and the second test memory address.

Note that the step 440 involves in some examples a negative detection by the MBIST controller 200, in other words that despite the deliberately introduced inconsistency between the stored error protection code and the actual address from which the data item and stored code are retrieved does not result in a flagged error. If the memory error protection circuitry 260, 270 is operating correctly, then an error (or in some examples, an error corresponding to the deliberately introduced inconsistency, for example the address bit(s) inverted by the use of XM) should be flagged. If no error is flagged, or in other examples if an error inconsistent with the deliberately introduced error is flagged, then this indicates a fault condition at the step 440. Therefore the step 440 can involve one or more of:

the MBIST controller 200 detecting an indication (by one or both of the flags 290) that there has been "any error" in the address field (a detection of "no error" indicating a fault condition);

the MBIST controller 200 detecting an indication (by one or both of the flags 290) that there has been a "fatal error" in the address field (a detection of "no fatal error" indicating a fault condition); and/or the MBIST controller 200 detecting an indication (by the syndrome 285) that there has been an error at a particular bit position or particular bit positions in the address field (a detection of an error at a different bit position to one inverted by XM, or a lack of detection of an error at a bit position inverted by XM indicating a fault condition).

Figure 5:
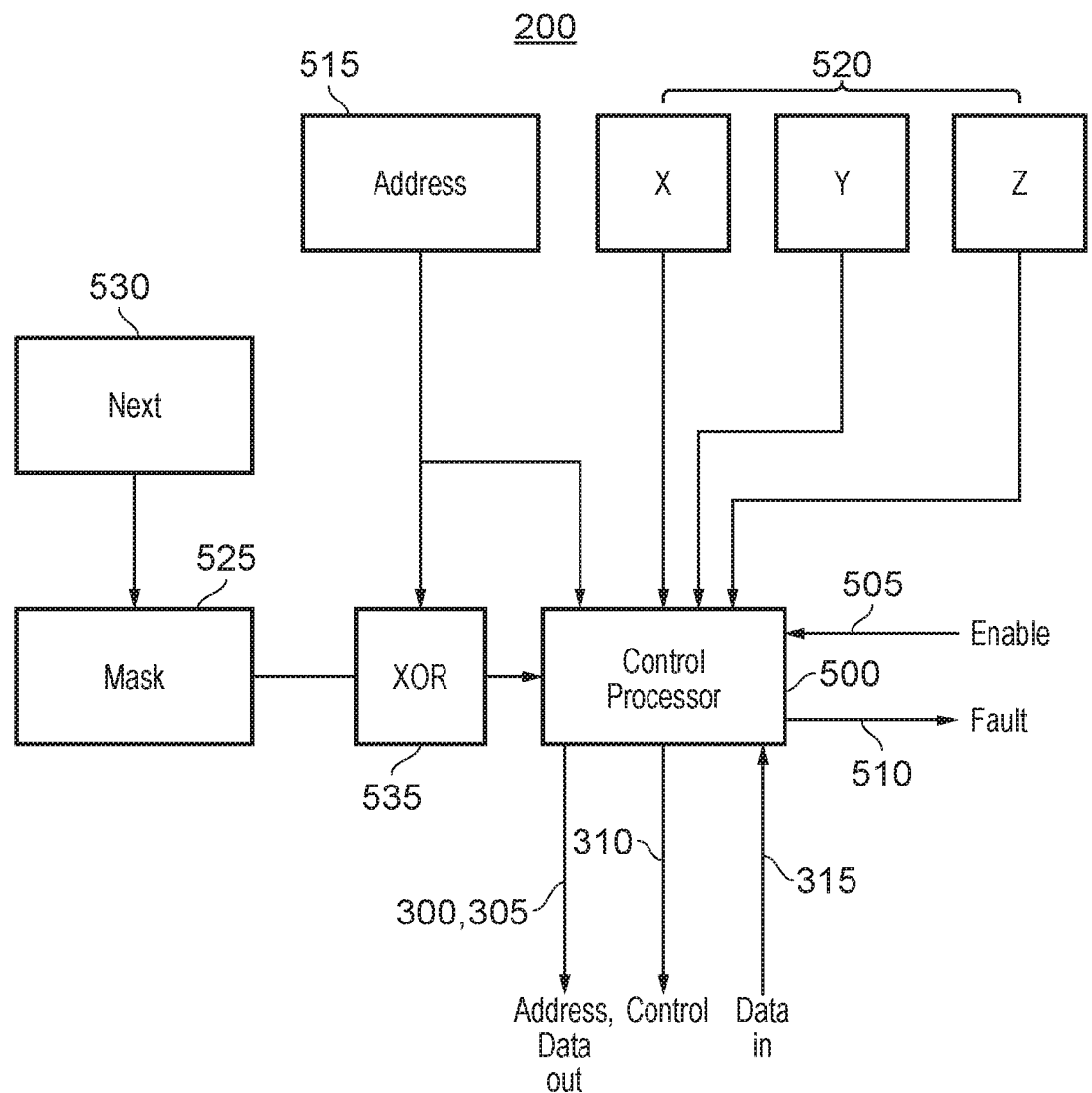
FIG. 5 schematically illustrates an example of memory built-in self-testing circuitry.

FIG. 5 schematically illustrates an example of the MBIST controller 200, comprising a control processor 500 configured to generate address and data output signals (as the test address and data signals 300, 305) control output signals 310 and to receive data input signals 315, and to provide the functionality of fault detection circuitry. The control processor can also be responsive to an enable signal 505, for example provided by the supervisor processor 35 to indicate that a test cycle should be performed, and can generate a fault indication 510 in the case that a fault is detected by the execution of the algorithms or methods discussed above.

An address register 515 stores a current address variable A. Up to three further registers 520 store however many of the variables X, Y, Z are required according to the particular implementation of the techniques discussed above, and a mask register 525 stores the current mask value XM. Circuitry 530 (operating under the control of the control processor 500) selects the next mask value at the step 11 discussed above. The control processor 500 can make use of the address value A as stored in the register 515 or as modified by an XOR operation by circuitry 535 in the form A XOR XM discussed above.

Using the circuitry of FIG. 5, the MBIST controller 200 performs the example methods discussed above.

The control processor acts as fault detection circuitry configured to detect a fault in response to a lack of detection, by the memory error protection circuitry, of an inconsistency between the error protection code retrieved from the second memory entry and a verification error protection code dependent upon the second test memory address and the test value.

The registers 515, 525, the circuitry 530 and the XOR function 535, in collaboration with the control processor 500, provide the functionality of an address generator to generate one of the first test memory address and the second test memory address by inverting a set of bits comprising a predetermined number n of bits of the other of the first test memory address and the second test memory address, n being at least one. As discussed above, where the memory error protection circuitry is configured to detect an error of up to m bits in a retrieved data item and a memory address from which that data item is retrieved, in some examples n is no greater than m.

Further example testing techniques will now be described.

Single Point Fault Detection

Test methods similar to those discussed above can also be used for single point fault detection in address protection logic. Once again, a looped approach similar to that described above may be used.

The loop below is repeated for all protected memory address bits. The address protection field may not be wide enough not cover all address bits on the associated memory and so only the lower address bits would normally be covered. The algorithm detects faults in the code generation and address error detection logic that cause an error to be reported when the memory does not contain a fault in its address decoder circuits. It generates addresses that are based on BP by inverting each address bit in turn. The error detection logic is used to check for faults in the generation logic and vice versa. The data field value is not important and is a fixed pattern, FP. The XM variable is initialized to 1.

for each A (BP, ~BP) {
  for (i=0; i<protected address width; i++) {
    1. Read RAM entry (A XOR XM) direct and store in X (save entry)
    2. Write FP to RAM entry (A XOR AM) via ECC generation logic (indirect) (initialize entry)
    3. Read RAM entry (A XOR AM) via ECC checking logic (indirect) and check that no error is reported
    4. Write X to RAM entry (A XOR AM) direct (restore entry)
    5. Read RAM entry (A XOR AM) direct and check that it is equal to X
    6. XM<<1 (generate next XM value)
  }
}

Note that step 5 is not essential to the test method and may be omitted. Note also that steps 1, 4 and 5 may be omitted if the contents of entry (A XOR XM) do not need to be preserved so as to be available after the completion of the test.

Latent Fault Detection in Data Protection Logic

In a further example arrangement, the loop below is repeated for the full data width of a memory, testing the code and data bits of the protection logic. This algorithm uses a data pattern, P, based on BP and injects errors into the data and the code fields. The algorithm detects faults in the code generation, error detection and correction logic that inhibit them from detecting faults in code and data bits stored in memory. The address A variable can be initialized to any value, for example 0 and the XM variable is initialized to 1 for single bit error injection.

for each P (BP, ~BP) {
  for (i=0; i<data+code width; i++) {
    1. Read RAM entry A direct and store in X (save entry)
    2. Write P to RAM entry A via ECC generation logic (indirect) (initialize entry)
    3. Read RAM entry A direct and store in Y
    4. Write (Y XOR XM) to entry A (inject error)
    5. Read RAM entry A via error detection logic and check that a correctable error is indicated
    6. Read RAM entry A via the error correction logic and check that it is equal to Y
    7. Write X to RAM entry A (restore entry)
    8. Read RAM entry A and check that it is equal to X
    9. XM<<1 (generate next XM value)
  }
}

The test may also be repeated to check that two faults can be detected by initializing two bits in the XM variable to 1. In this case step 6 would be omitted and step 5 changed to check that a non-correctable (two-bit) error is reported.

Step 8 is not essential to the test method and may be omitted. Steps 1, 7 and 8 may be omitted if the contents of entry A do not need to be preserved after the test. Steps 1, 7 and 8 may be placed outside the outer "for . . . " loop if testing is not suspended after a loop iteration.

Single Point Fault Detection in Data Protection Logic

In a further example, the loop below is repeated for all bits in the data field. This algorithm uses a data pattern, P, based on BP and it inverts all bits of P in turn. The algorithm detects faults in the code generation, error detection and correction logic that cause an error to be reported when the code and data bits stored in memory do not contain an error. Variable A can be initialized to any value, for example 0 and the XM variable is initialized to 1.

for each P (BP, ~BP) {
  for (i=0; i<data field width; i++) {
    1. Read RAM entry A direct and store in X (save entry)
    2. Write (P XOR XM) to RAM entry A via ECC generation logic (indirect) (initialize entry)
    3. Read RAM entry A via the error detection logic (indirect) and check that no error is reported
    4. Read RAM entry A via the ECC correction logic (indirect) and check that it is equal to (P XOR XM)
    5. Write X to RAM entry A direct (restore entry)
    6. Read RAM entry X direct and check that it is equal to X
    7. XM<<1 (generate next XM value)
  }
}

Here, step 6 is not essential to the test method and may be omitted. Steps 1, 5 and 6 may be omitted if the contents of entry A do not need to be preserved. Steps 1, 5 and 6 may be placed outside the outer "for each P (BP, ~BP) . . . " loop if testing is not suspended after a loop iteration.

Comparison with Alternative Test Methods

An alternative method of testing this logic in-field would be to use logic BIST (LBIST). However, in contrast to the techniques discussed above this can be considered somewhat invasive because it corrupts the logic and memory state, it takes a relatively long time to run, the processor is unavailable during testing and, the processor must be reset and rebooted after testing.

In the present application, the words "configured to . . . " are used to mean that an element of an apparatus has a configuration able to carry out the defined operation. In this context, a "configuration" means an arrangement or manner of interconnection of hardware or software. For example, the apparatus may have dedicated hardware which provides the defined operation, or a processor or other processing device may be programmed to perform the function, in which case software or program instructions by which the function is performed, and a providing medium such as a non-transitory machine-readable medium by which such software or program instructions are provided (for example, stored) are considered to represent embodiments of the disclosure. "Configured to" does not imply that the apparatus element needs to be changed in any way in order to provide the defined operation.

Although illustrative embodiments of the present techniques have been described in detail herein with reference to the accompanying drawings, it is to be understood that the present techniques are not limited to those precise embodiments, and that various changes, additions and modifications can be effected therein by one skilled in the art without departing from the scope and spirit of the techniques as defined by the appended claims. For example, various combinations of the features of the dependent claims could be made with the features of the independent claims without departing from the scope of the present techniques.

The invention claimed is:

1. Apparatus comprising:
    a memory circuitry having a plurality of addressable memory entries storing respective data items and associated error protection codes;
    a memory error protection circuitry to generate an error protection code for a given data item stored to the memory circuitry, the error protection code for the given data item stored to the memory circuitry depending upon at least the given data item and a memory address defining a memory entry to which the given data item is stored, and to perform a check operation to check for consistency between a retrieved data item, the memory address defining a memory entry from which the given data item is retrieved and the error protection code associated with the retrieved data item;
    a memory built-in self-test circuitry to test the memory and memory error protection circuitry; and
    an access circuitry to provide an indirect access path between the memory built-in self-test circuitry a memory which accesses the memory circuitry via the memory error protection circuitry and a direct access path between the memory built-in self-test circuitry and a memory entry which bypasses the memory error protection circuitry;
    the memory built-in self-test circuitry being configured to execute a test operation by writing a test value to a first memory entry of the memory circuitry having a first test memory address via the indirect access path; retrieving the test value and associated error protection code from the first memory entry by the direct access path; writing the retrieved test value and associated error protection code to a second memory entry having a second test memory address via the direct access path, there being a difference in at least one bit between the first test memory address and the second test memory address; and retrieving the test value and associated error protection code from the second memory entry via the indirect access path;
    the memory built-in self-test circuitry comprising fault detection circuitry configured to detect a fault condition when the result of the check operation performed by the memory error protection circuitry is inconsistent with the difference between the first test memory address and the second test memory address.

2. Apparatus according to claim 1, in which the fault detection circuitry is configured to detect a fault in response to a lack of detection, by the memory error protection circuitry, of an inconsistency between the error protection code retrieved from the second memory entry and a verification error protection code dependent upon the second test memory address and the test value.

3. Apparatus according to claim 1, in which the memory built-in self-test circuitry comprises an address generator to generate one of the first test memory address and the second test memory address by inverting a set of bits comprising a predetermined number n of bits of the other of the first test memory address and the second test memory address, n being at least one.

4. Apparatus according to claim 3, in which:
    the memory error protection circuitry is configured to detect an error of up to m bits in a retrieved data item and a memory address from which that data item is retrieved; and
    n is no greater than m.

5. Apparatus according to claim 3, in which the memory built-in self-test circuitry is configured to execute a succession of test operations, each for a different respective pair of a first test memory address and a second test memory address.

6. Apparatus according to claim 5, in which the succession of test operations are configured to use a common memory address as one of the first test memory address and the second test memory address but for each test operation of the succession of test operations, different respective sets of bits are inverted to generate the other of the first test memory address and the second test memory address.

7. Apparatus according to claim 1, in which the memory built-in self-test circuitry is configured during the test operation to inhibit access by other data processing circuitry to at least the memory entries defined by the first test memory address and the second test memory address.

8. Apparatus according to claim 7, in which the memory built-in self-test circuitry is configured to execute groups of one or more test operations interspersed by intervals during which access to the memory circuitry by other data processing circuitry is allowed, in which the each interval is longer than the length of a group of one or more test operations.

9. Apparatus according to claim 1, in which the memory error protection circuitry comprises:
    a write-side memory error protection circuitry to generate the error protection code for a data item stored to the memory circuitry; and
    a read-side memory error protection circuitry to perform the check operation to check for consistency between a retrieved data item, the memory address defining a memory entry from which the given data item is retrieved and the error protection code associated with the retrieved data item.

10. Apparatus according to claim 9, in which the read-side memory error protection circuitry is configured to generate a check error protection code from a read memory address and a data item retrieved from the read memory address, and to compare the check error protection code with the error protection code retrieved from the read memory address.

11. Apparatus according to claim 10, in which the read-side memory error protection circuitry comprises error correction circuitry to correct errors of up to p bits in a retrieved data item.

12. A method comprising:
- storing respective data items and associated error protection codes using a memory circuitry having a plurality of addressable memory entries;
- generating, using a memory error protection circuitry, an error protection code for a given data item stored to the memory circuitry, the error protection code for a given data item stored to the memory circuitry depending upon at least the given data item and a memory address defining a memory entry to which the given data item is stored;
- performing a check operation to check for consistency between a retrieved data item, the memory address defining a memory entry from which the given data item is retrieved and the error protection code associated with the retrieved data item;
- providing, using an access circuitry, an indirect access path between a memory built-in self-test circuitry a memory which accesses the memory via the memory error protection circuitry and a direct access path between the memory built-in self-test circuitry and a memory entry which bypasses the memory error protection circuitry;
- the memory built-in self-test circuitry executing a test operation by:
- writing a test value to a first memory entry of the memory circuitry having a first test memory address via the indirect access path;
- retrieving the test value and associated error protection code from the first memory entry by a direct access path which bypasses the error protection circuitry;
- writing the retrieved test value and associated error protection code to a second memory entry having a second test memory address different to the first test memory address via the direct access path; and
- retrieving the test value and associated error protection code from the second memory entry via the indirect access path; and
- detecting a fault condition when the result of the check operation performed by the memory error protection circuitry is inconsistent with the difference between the first test memory address and the second test memory address.

* * * * *